(12) United States Patent
Chen et al.

(10) Patent No.: US 9,650,243 B2
(45) Date of Patent: May 16, 2017

(54) METHOD AND APPARATUS FOR A SEAL RING STRUCTURE

(71) Applicant: Taiwan Semiconductor Manufacturing Company, Ltd., Hsin-Chu (TW)

(72) Inventors: Ting-Ying Chen, Hsin-Chu (TW); Yi Hsun Chiu, Zhubei (TW); Ching-Hou Su, Hsin-Chu (TW); Chyi-Tsong Ni, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 15/067,043

(22) Filed: Mar. 10, 2016

(65) Prior Publication Data

US 2016/0194199 A1   Jul. 7, 2016

Related U.S. Application Data

(63) Continuation of application No. 13/759,549, filed on Feb. 5, 2013, now Pat. No. 9,287,188.

(51) Int. Cl.
*H01L 21/78* (2006.01)
*B81C 1/00* (2006.01)
(Continued)

(52) U.S. Cl.
CPC ...... *B81C 1/00825* (2013.01); *B81C 1/00269* (2013.01); *H01L 21/50* (2013.01); *H01L 23/10* (2013.01); *H01L 24/29* (2013.01); *H01L 24/83* (2013.01); *H01L 24/94* (2013.01); *B81B 2207/03* (2013.01); *B81C 2203/019* (2013.01); *B81C 2203/0118* (2013.01); *B81C 2203/035* (2013.01); *B81C 2203/036* (2013.01); *B81C 2203/054* (2013.01); *H01L 22/32* (2013.01);
(Continued)

(58) Field of Classification Search
CPC ..... B81C 1/00269; C25D 5/505; H01L 21/78; H01L 27/14618
See application file for complete search history.

(56) References Cited

U.S. PATENT DOCUMENTS 5,773,986 A   6/1998   Thompson et al.
6,661,084 B1   12/2003   Peterson et al.
(Continued)

FOREIGN PATENT DOCUMENTS

CN   101159260 A   4/2008

*Primary Examiner* — Jerome Jackson, Jr.
*Assistant Examiner* — Fang-Xing Jiang
(74) *Attorney, Agent, or Firm* — Slater Matsil, LLP

(57) ABSTRACT

A wafer seal ring may be formed on a first and/or a second wafer. One or both of the first and/or second wafers may have one or more dies formed thereon. The wafer seal ring may be formed to surround the dies of a corresponding wafer. One or more die seal rings may be formed around the one or more dies. The wafer seal ring may be formed to a height that may be approximately equal to a height of one or more die seal rings formed on the first and/or second wafer. The wafer seal ring may be formed to provide for eutectic or fusion bonding processes. The first and second wafers may be bonded together to form a seal ring structure between the first and second wafers. The seal ring structure may provide a hermetic seal between the first and second wafers.

20 Claims, 5 Drawing Sheets

(51) Int. Cl.
*H01L 23/10* (2006.01)
*H01L 21/50* (2006.01)
*H01L 23/00* (2006.01)
*H01L 21/66* (2006.01)

(52) U.S. Cl.
CPC ........ *H01L 24/32* (2013.01); *H01L 2224/291* (2013.01); *H01L 2224/2908* (2013.01); *H01L 2224/29011* (2013.01); *H01L 2224/29082* (2013.01); *H01L 2224/29109* (2013.01); *H01L 2224/29111* (2013.01); *H01L 2224/29124* (2013.01); *H01L 2224/29144* (2013.01); *H01L 2224/29147* (2013.01); *H01L 2224/32148* (2013.01); *H01L 2224/32238* (2013.01); *H01L 2224/32268* (2013.01); *H01L 2224/83123* (2013.01); *H01L 2224/83127* (2013.01); *H01L 2224/83191* (2013.01); *H01L 2224/83193* (2013.01); *H01L 2224/83204* (2013.01); *H01L 2224/83805* (2013.01); *H01L 2224/94* (2013.01); *H01L 2924/01322* (2013.01); *H01L 2924/1461* (2013.01); *H01L 2924/15787* (2013.01)

(56) References Cited

U.S. PATENT DOCUMENTS

| | | | |
|---|---|---|---|
| 7,683,478 | B2 | 3/2010 | Chen et al. |
| 7,871,857 | B1* | 1/2011 | Lei .......................... H01L 21/78 |
| | | | 257/686 |
| 8,485,416 | B2 | 7/2013 | Ebefors et al. |
| 8,736,039 | B2 | 5/2014 | Wu et al. |
| 8,736,045 | B1 | 5/2014 | Gooch et al. |
| 2004/0014308 | A1 | 1/2004 | Kellar et al. |
| 2008/0032484 | A1* | 2/2008 | Diep .................... B81C 1/00269 |
| | | | 438/455 |
| 2008/0237823 | A1 | 10/2008 | Martin |
| 2012/0049978 | A1 | 3/2012 | Pang et al. |
| 2012/0096813 | A1* | 4/2012 | Gooch ............. H01L 27/14618 |
| | | | 53/452 |
| 2012/0097733 | A1 | 4/2012 | Ebefors et al. |
| 2012/0223788 | A1 | 9/2012 | Altunkilic et al. |
| 2012/0280401 | A1 | 11/2012 | Tsutsue et al. |
| 2013/0058202 | A1* | 3/2013 | Chou .................... C25D 5/505 |
| | | | 369/126 |
| 2014/0124899 | A1 | 5/2014 | Gooch et al. |
| 2014/0220735 | A1 | 8/2014 | Teng et al. |

* cited by examiner

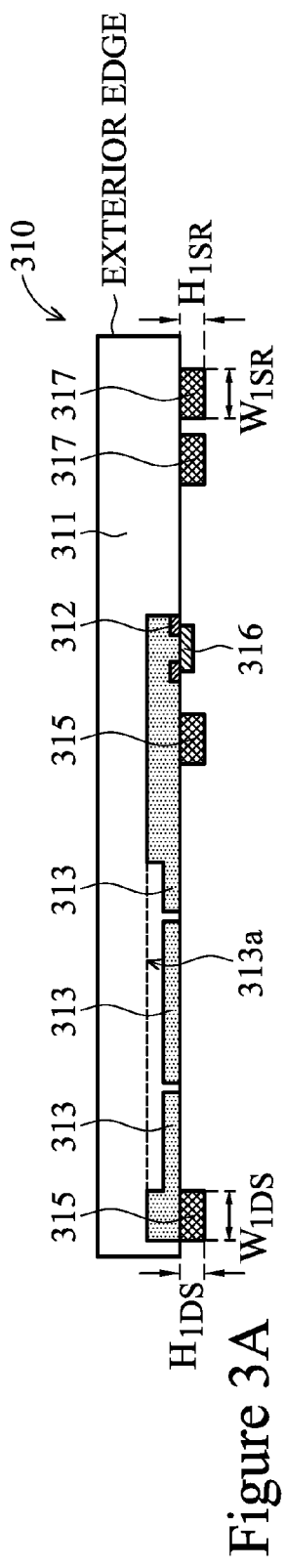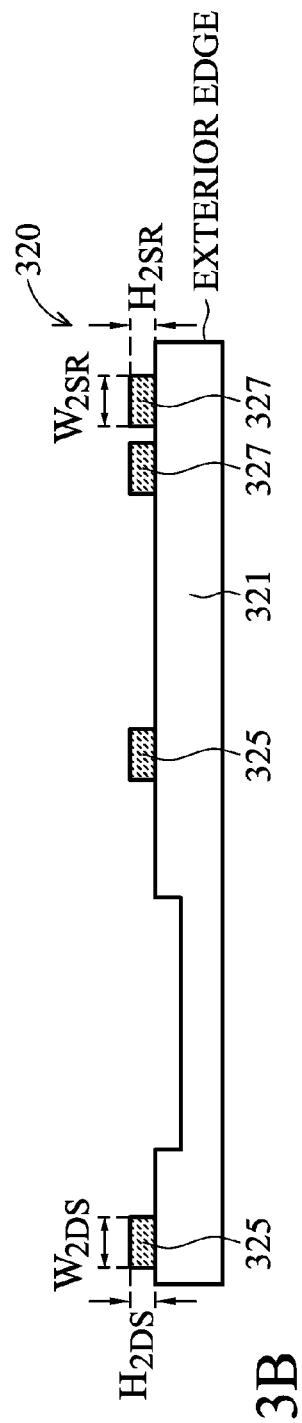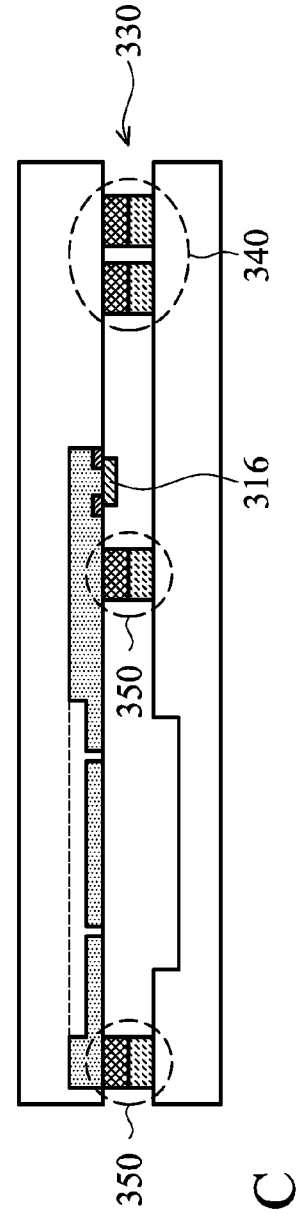
Figure 3A
Figure 3B
Figure 3C

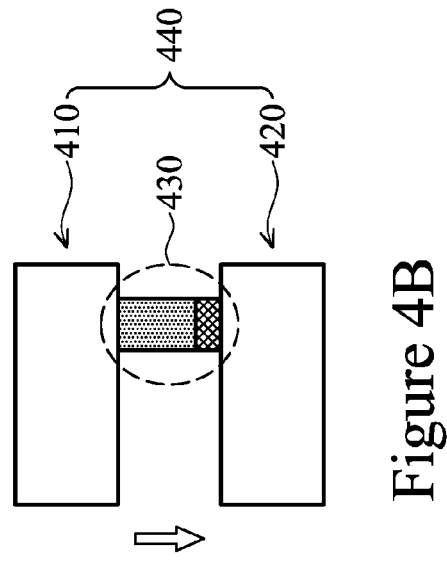
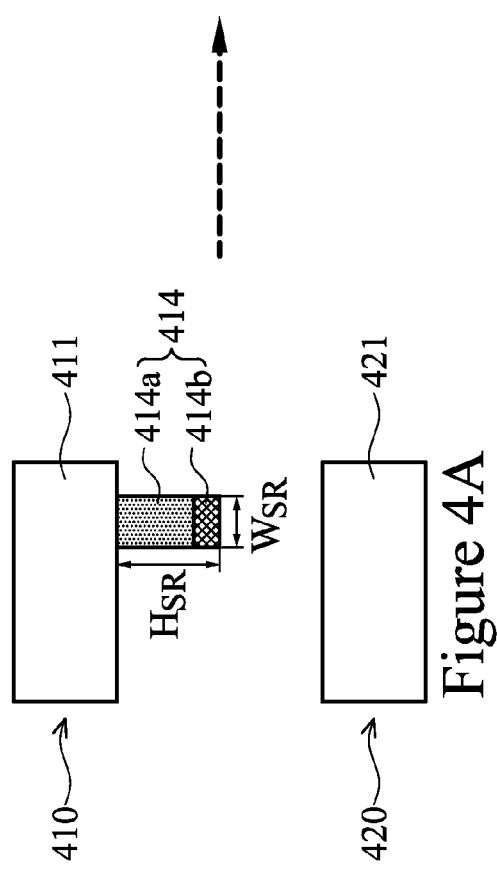
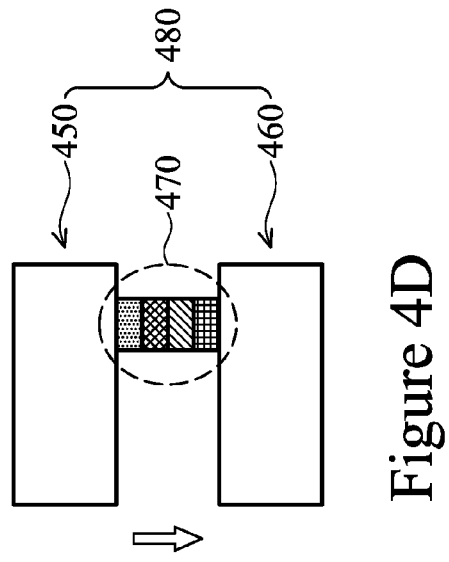
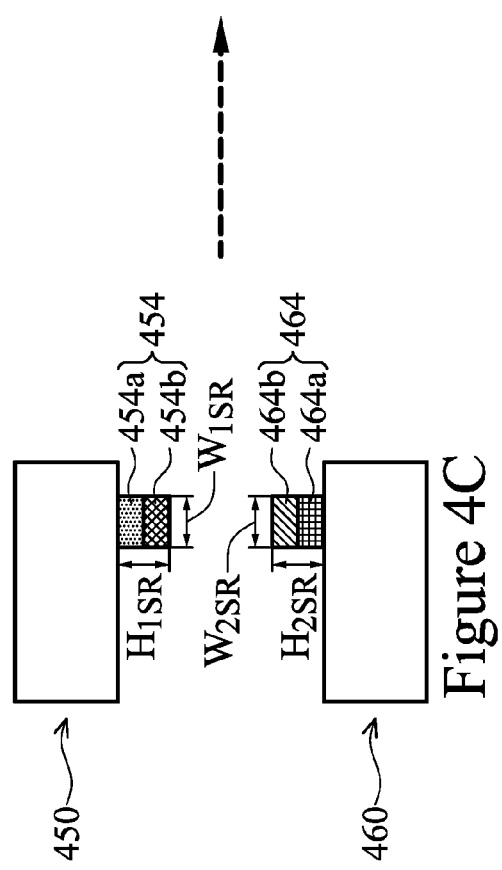

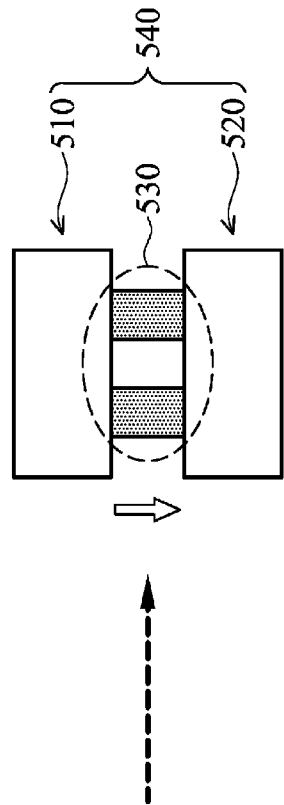
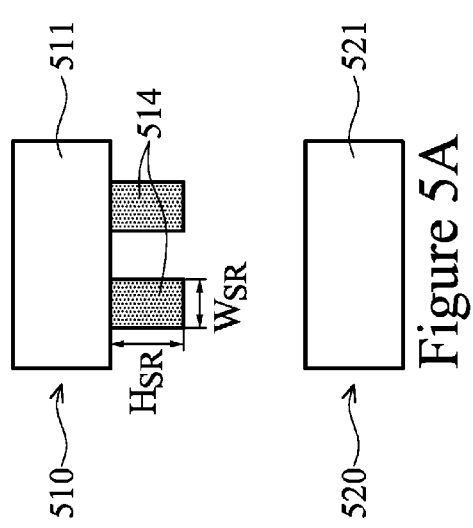
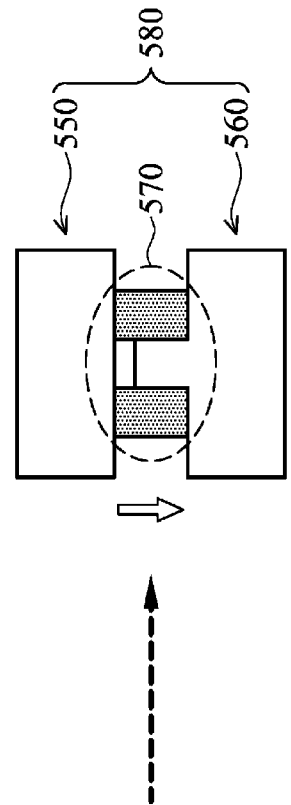
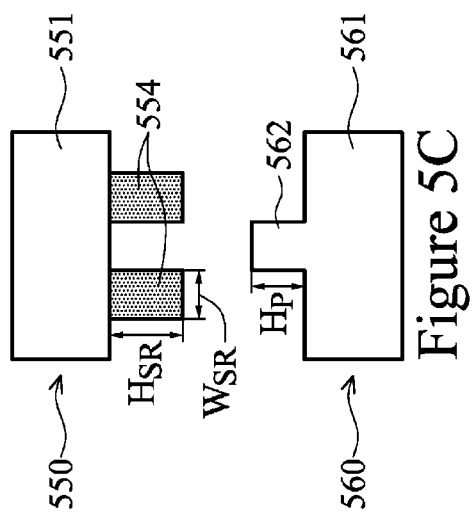
Figure 5A
Figure 5B
Figure 5C
Figure 5D

METHOD AND APPARATUS FOR A SEAL RING STRUCTURE

PRIORITY CLAIM AND CROSS-REFERENCE

The present application is a continuation of U.S. patent application Ser. No. 13/759,549, entitled "Method and Apparatus for a Seal Ring Structure," filed on Feb. 5, 2013, which application is incorporated by reference herein in its entirety. The present application is related to co-pending U.S. patent application Ser. No. 13/759,201, entitled "Method and Apparatus for a Wafer Seal Ring," filed on Feb. 5, 2013, commonly assigned to the assignee of the present application, which application is incorporated by reference herein in its entirety.

BACKGROUND

In a semiconductor manufacturing process, integrated circuits (also referred to as "dies") are fabricated in a die area on a semiconductor wafer. The semiconductor wafer goes through many processing steps before the dies are separated by cutting the semiconductor wafer. The processing steps can include lithography, etching, doping, grinding, blade cutting, die-sawing and/or depositing different materials. The processing steps can include wet and dry processing steps. Semiconductor wafers and/or separated dies can be stacked or bonded on top of each other to form a three-dimensional ("3D") IC. For example, a semiconductor wafer with micro electrical devices formed within can be bonded to another semiconductor wafer with micro electrical-mechanical system ("MEMS") devices formed within the wafer. After bonding, the wafers are cut or separated into bonded dies, which consists of devices from both wafers. In another example, a semiconductor wafer with MEMS devices formed within can also be bonded with another capping wafer that has cavities or recesses formed within. After bonding, the wafers are cut or separated into bonded dies, which consist of MEMS devices and a corresponding cap. During processing and bonding procedures, contaminants, chemicals, or residue may penetrate the die area and may adversely affect production yield of dies formed therein.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 3A-3C illustrate cross-sectional views of intermediate stages of forming a wafer seal ring in accordance with an embodiment;

FIGS. 4A-4D illustrate cross-sectional views of intermediate stages for forming a wafer seal ring in accordance with various embodiments; and FIGS. 5A-5D illustrate cross-sectional views of intermediate stages for forming a wafer seal ring in accordance with various embodiments.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Before addressing illustrative embodiments of the present disclosure in detail, various embodiments and advantageous features thereof will be discussed generally. For example, in some embodiments wafer level bonding may be performed wherein one or more of the wafers may be a processed wafer having dies formed thereon, wherein each die may include electrical devices and/or circuits. It should be noted that although embodiments discussed herein are described in the context of bonding processed wafers, other embodiments may bond processed or unprocessed wafers, carrier wafers, interposers, other types of substrates, or the like.

In an embodiment, die seal rings may be formed around one or more of the dies on a wafer, thereby providing die-level protection for the dies within each die seal ring of the bonded wafers. Wafers having dies formed thereon may also include test pads that may be used to connect to and/or test the functionality of electrical devices that may be formed within the dies. The test pads may be outside the die bonding pads or ring encircling the die(s), such as within the scribe lines of the wafer.

After bonding a pair of wafers, the bonded structure may be further processed, for example, to thin the wafers, form electrical connections, bonding additional wafers and/or substrates, or the like. Previous techniques for creating a seal between wafers utilized clamping along the edges of a pair of bonded wafer to seal the wafers. This previous technique resulted in an irregularly shaped, singular seal ring surrounding the dies. Post-bonding processing may expose the test pads and the die bonding pads to chemicals or processing residue that may corrode or damage the pads. Advantages of the embodiments described herein include dual ring die protection utilizing both die seal rings and wafer seal rings, as well as providing protection for the die bonding pads, die seal rings, the test pads and or the like using the wafer seal rings and/or seal ring structures.

Figure 1:
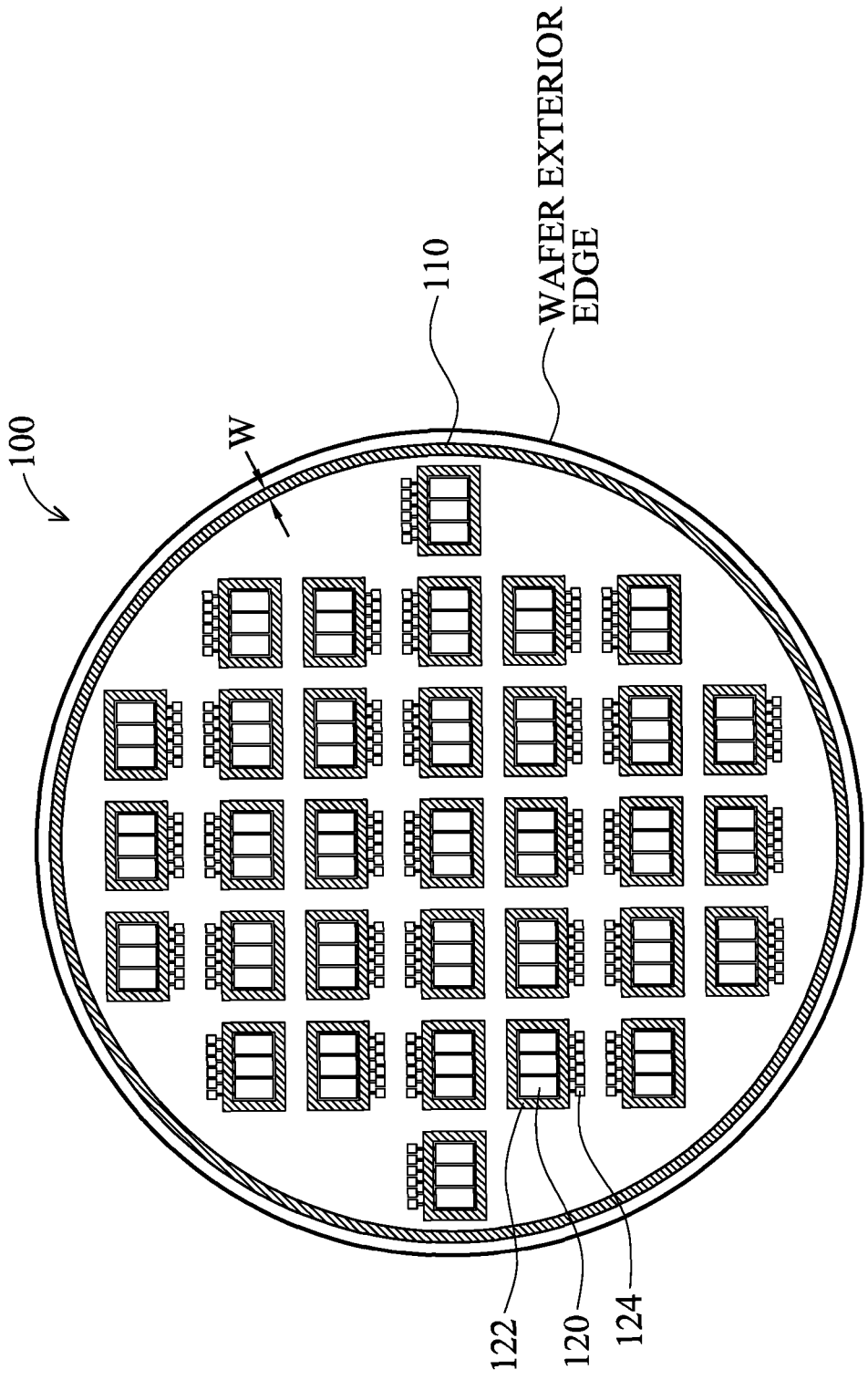
FIG. 1 illustrates a plan view of a wafer seal ring according to an embodiment.

Referring now to FIG. 1, there is illustrated a wafer 100 having a wafer seal ring 110 according to an embodiment. As illustrated in FIG. 1, the wafer seal ring 110 may be formed on a wafer 100 such that the wafer seal ring 110 surrounds one or more dies 120. The wafer seal ring 110 may be formed between the dies 120 and an exterior edge of the wafer 100. FIG. 1 further shows die seal rings 122 encircling each of the one or more dies 120. Each of the dies 120 may be electrically coupled to one or more conductive test pads 124 that may provide electrical connections to test and/or verify functionality of electrical devices (not shown) that may be formed in the dies 120. FIG. 1 illustrates that the test pads 124 are positioned outside of the die seal rings 122 for illustrative purposes, and in other embodiments, the test pads 124 may be positioned within, outside, or both within and outside of the die seal rings 122.

The wafer seal ring 110, as shown in FIG. 1, may be formed having a circular shape outlining a perimeter surrounding the dies 120. The wafer seal ring 110 may have an approximately uniform width W. The width W of the wafer seal ring 110 may be sized based on area of the wafer 100 not occupied by the dies 120, design guidelines and/or limitations of the equipment used to form the wafer seal ring 110. In an illustrative example that is not meant to limit the embodiments described herein, the width W may range from approximately 30 µm to approximately 80 µm.

A single circular shape for the wafer seal ring 110 is shown in FIG. 1 for illustrative purposes only. In other embodiments, the wafer seal ring 110 may comprise a plurality of circular shapes, such as a plurality of concentric circular shaped rings successively surrounding the dies 120 formed between the dies 120 and the exterior edge of the wafer 100.

Figure 2:
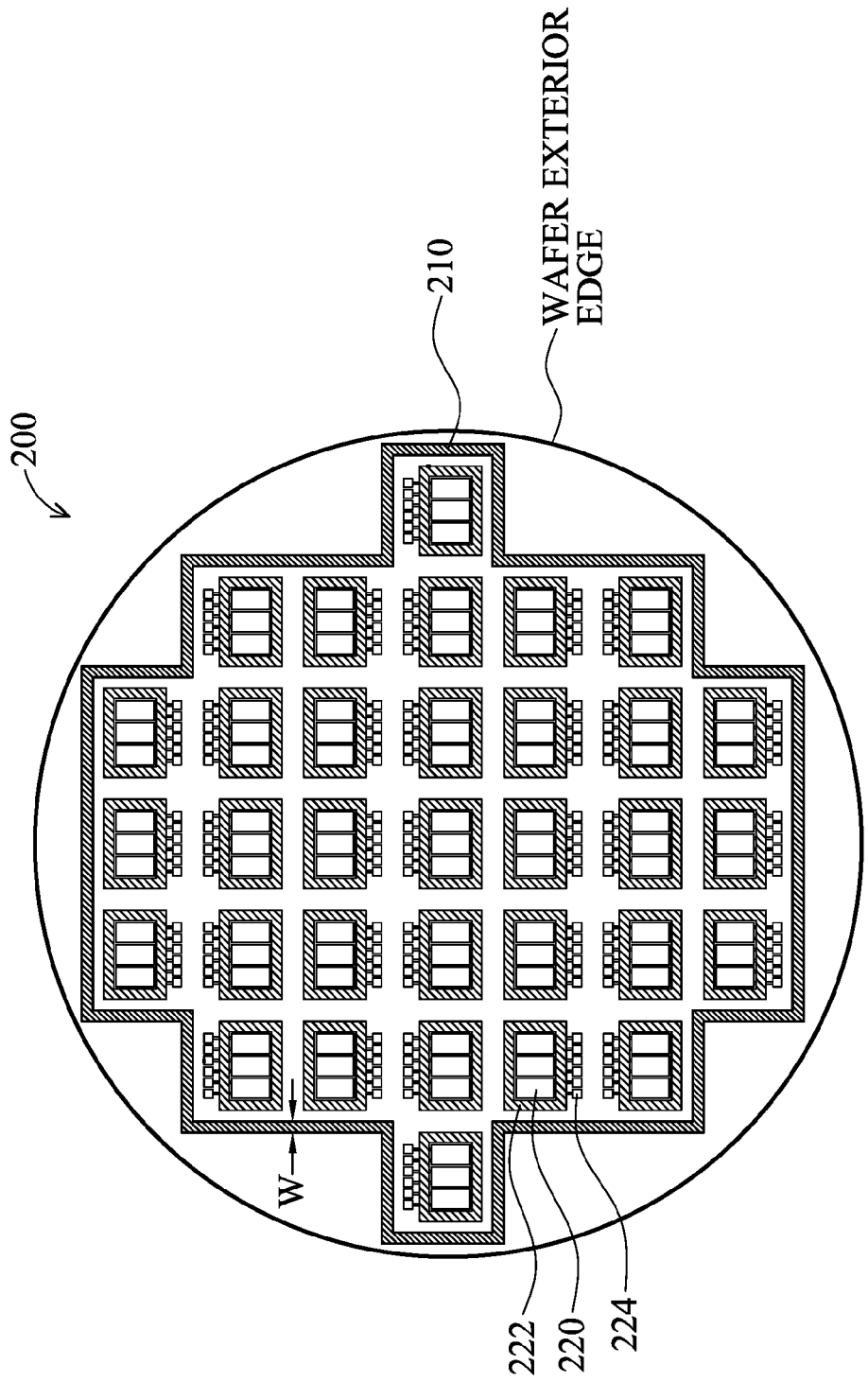
FIG. 2 illustrates a plan view of another wafer seal ring according to another embodiment.

The wafer seal ring 110 may be of any suitable shape. For example, FIG. 2 illustrates a plan view of a wafer 200 having a wafer seal ring 210 according to another embodiment. As illustrated in FIG. 2, the wafer 200 may include one or more dies 220 wherein a die seal ring 222 around each of the one or more dies 220. Each of the dies 220 may be electrically coupled to one or more conductive test pads 224 that may provide electrical connections to test and/or verify functionality of electrical devices (not shown) that may be formed in the dies 220.

In the embodiment as shown in FIG. 2, the wafer seal ring 210 may be formed in manner that may outline a perimeter surrounding a plurality of dies 220 using a plurality of adjoined segments, such as, for example, straight-line segments. The wafer seal ring 210 may be formed between the plurality of dies 220 and an exterior edge of the wafer 200. The wafer seal ring 210 may have an approximately uniform width W. The width W of the wafer seal ring 210 may be sized based on area of the wafer 200 not occupied by the dies 220, design guidelines and/or limitations of the equipment used to form the wafer seal ring 210. In an illustrative example that is not meant to limit the embodiments described herein, the width W may range from approximately 30 μm to approximately 80 μm.

A single wafer seal ring 210 is shown in FIG. 2 for illustrative purposes only. In other embodiments, the wafer seal ring 210 may comprise a plurality of rings (not shown), which may be polygonal or circular surrounding the plurality of dies 220. It should be noted that a plurality of rings may be used of various shapes. For example, a wafer may have a polygonal ring inside a circular ring and the like. The shape of the wafer seal rings shown in FIGS. 1 and 2 are provided for illustrative purposes only and are not intended to implicate limitations therein. Other embodiments may utilize other shapes.

In various embodiments, the wafer 100 (FIG. 1) and/or the wafer 200 (FIG. 2) may be an interposer, a device wafer, a wafer having MEMS devices formed therein, a handle wafer or the like. In various embodiments, the wafer seal rings 110, 210 may be made of materials that may provide for bonding to another wafer (not shown) using a eutectic or a fusion bonding process. In various embodiments, the wafer seal rings 110, 210 may include of a plurality of concentric shaped structures (not shown) formed around the plurality of dies 120, 220 between the plurality of dies 120, 220 and the corresponding edges of the respective wafers 100, 200.

FIGS. 3A-3C illustrate cross-sectional views of intermediate stages of forming wafer seal ring in accordance with an embodiment. Referring first to FIG. 3A, a first wafer 310 may include a first substrate 311 having first electrical device layers 313, and/or one more first interconnects 312. The composition, connections and layers as described for the first wafer 310 are provided for illustrative purposes only are not intended to implicate specific limitations of the first wafer 310. Only a portion of the first wafer 310 is shown in FIGS. 3A and 3C.

A first die seal ring 315 may be formed on the first wafer 310. A first wafer seal ring 317 may be formed on the first wafer 310. The first wafer seal ring 317, as shown in FIG. 3A shows two seal rings for illustrative purposes only. In various embodiments, more or fewer wafer seal rings may be formed on the first wafer 310. One or more test pads 316 may be formed on the first wafer, which may be coupled to electrical devices (not shown) formed within the first wafer 310.

The first wafer seal ring(s) 317, as shown in FIG. 3A, may be formed in a manner that may provide for wafer bonding using eutectic bonding processes. In such embodiments, the first wafer seal ring(s) 317 and/or the first die seal 315 may be made of one or more metal layers including, but not limited to, a eutectic alloy such as AlCu, AlGe or a low-melting point metal layer such as In, Au, Sn, Cu or other like material. The first wafer seal ring(s) 317 may be formed to a height $H_{1SR}$ and an approximately uniform width $W_{1SR}$. The first die seal ring 315 may be formed to a height $H_{1DS}$ and a width $W_{1DS}$.

The height $H_{1SR}$ of the first wafer seal ring(s) 317 may be formed to be approximately equal to the height $H_{1DS}$ of the first die seal ring 315. The width $W_{1SR}$ of the first wafer seal ring(s) 317 may be formed to a width as determined by a designer, design guidelines and/or limitations of equipment forming the first wafer seal ring(s) 317. For example, the width $W_{1SR}$ may be related to an available area of the first wafer 310 wherein the first wafer seal ring(s) 317 may be formed. Although the width $W_{1SR}$ may be approximately uniform for each first wafer seal ring 317, in various embodiments, the individual uniform width of each ring may differ from or be approximately equal to the width of another wafer seal ring on the first wafer 310. In an illustrative example that is not meant to limit the embodiments described herein, the width $W_{1SR}$ of the first wafer seal ring(s) 317 may range from approximately 30 μm to approximately 80 μm.

In various embodiments, the first electrical device layers 313 may include metal layers, dielectric layers or semiconductor material layers. For metal layers, copper, aluminum, gold or other like materials may be used in the first electrical device layers 313. For dielectric layers, one or more dielectric materials such as oxide, nitride, silicon oxide, silicon nitride, low-k dielectrics such as carbon doped oxides, extremely low-k dielectrics such as porous carbon doped silicon dioxide, a polymer such as polyimide, or a combination thereof may be used in the first electrical device layers 313. For semiconductor material layers, silicon, quartz, ceramic, silicon-on-insulator ("SOI"), gradient, hybrid orientation materials or other materials may be used in the first electrical device layers 313.

In various embodiments, the first electrical device layers 313 may also include active and/or passive electrical devices (not shown) such as transistors, capacitors, resistors, combinations of these and the like formed therein. In various embodiments, the first electrical device layers 313 may also include a cavity 313a wherein MEMS electrical devices (not shown) may be formed in an area between first die seal ring 315. For example, the MEMS electrical devices may be a vibrating mass, elastic strings or coils for performing functions in sensors, gyroscopes, accelerometers, RF wafers or optical wafers. In an illustrative example, as shown in FIGS. 3A and 3C, the first wafer 310 may include the open cavity 313a wherein MEMS electrical devices (not shown) may be formed. The MEMS electrical devices may include movable elements (not shown) within the cavity.

In an embodiment, the first interconnects 312 may be formed, independent of each other, of copper, aluminum, gold or other like materials to provide conductive paths between electrical devices formed in the first electrical device layers 313. The first interconnects 312 may be formed through a process such as, for example, CVD, PVD, electrochemical plating, one or more subtractive etch processes, single Damascene techniques, and/or dual-Damascene techniques, the like or other acceptable methods. In various embodiments, the first electrical device layers 313, and/or the first interconnects 312 may be used to form re-distribution layers ("RDLs") (not shown) within the first wafer 310. The RDLs may be formed using an appropriate process, such as those discussed above In various embodiments, the test pads 316 may be formed of one or more metal layers including, but not limited to, a eutectic alloy such as AlCu, AlGe or the like or a low-melting point metal layer such as In, Au, Sn, Cu or other like material. In an embodiment, the first substrate 311 may comprise bulk silicon. In other embodiments, first substrate 311 may comprise any semiconductor substrate, ceramic substrate, quartz substrate or the like. Other substrates that may be used include multi-layered substrates, gradient substrates, or hybrid orientation substrates.

As shown in FIG. 3B, a second wafer 320 may be provided. Only a portion of the second wafer 320 is illustrated in FIG. 3B. The second wafer 320 may include a second substrate 321. The second wafer 320 may also include second electrical device layers and second interconnects (all not shown).

The second wafer 320 may have formed thereon a second die seal ring 325. The second wafer 320 may also have formed thereon a second wafer seal ring 327. The second wafer seal ring 327, as shown in FIG. 3B shows two seal rings on the second wafer 320 for illustrative purposes only. In various embodiments, more or fewer wafer seal rings may be formed on the second wafer 320. Only a portion of the second wafer 320 is shown in FIGS. 3B and 3C.

The second wafer seal ring(s) 327, as shown in FIG. 3B, may be formed in a manner that may provide for wafer bonding process using eutectic bonding processes. In such embodiments, the second wafer seal ring(s) 327 and/or the second die seal ring may be made of one or more metal layers including, but not limited to, a eutectic alloy such as AlCu, AlGe or a low-melting point metal layer such as In, Au, Sn, Cu or other like material. The second wafer seal ring(s) 327 may be formed to a height $H_{2SR}$ and an approximately uniform width $W_{2SR}$. The second die seal ring 325 may be formed to a height $H_{2DS}$ and a width $W_{2DS}$.

The height $H_{2SR}$ of the second wafer seal ring(s) 327 may be formed to be approximately equal to the height $H_{2DS}$ of the second die seal ring 325. The second wafer seal ring(s) 327 may be formed to align and have an approximately equal width $W_{2SR}$ with the corresponding first wafer seal ring(s) 317, which may promote bonding and sealing for the first and second wafer seal rings 317, 327. In various embodiments, the height $H_{1SR}$ of the first seal ring 317, the height $H_{1DS}$ of the first die seal ring 315, the height $H_{2SR}$ of the second seal ring 327 and/or the height $H_{2DS}$ of the second die seal ring 325 may be formed to heights ranging from approximately 5000 Å to approximately 20,000 Å.

In an embodiment, the second wafer 320 may be formed as a handle-type wafer, without electrical devices being formed therein. In an embodiment, the second wafer 320 may be formed with passive, active and/or MEMS electrical devices formed therein. The inclusion or exclusion of electrical devices, connections and/or layers is not intended to implicate specific limitations of the second wafer 320.

Given the partial, cross-sectional views of the first and second wafers 310, 320 as shown in FIGS. 3A-3B, an overall shape of the first and second wafer seal rings 317, 327 is not fully illustrated. It should be understood, however, that the first and second wafer seal rings 317, 327 may be formed in a manner to surround the corresponding first and second die seal rings 315, 325 between the die seal rings 315, 325 and an exterior edge of the respective first and second wafers 310, 320. The shape of the first and second wafer seal rings 317, 327 may vary as described for the various embodiments discussed herein.

As illustrated in FIG. 3C, the first wafer 310 and the second wafer 320 may be aligned and bonded together to form a bonded structure 330. For the bonded structure 330, the first wafer seal ring 317 of the first wafer 310 may be bonded to corresponding second wafer seal ring 327 of the second wafer 320 to form a seal ring structure 340. The first die seal ring 315 of the first wafer 310 may be bonded to corresponding second die seal ring 325 of the second wafer 320 to form a die seal ring structure 350.

The first and second wafers 310, 320 as shown in FIG. 3C may, for example, be aligned and bonded using a eutectic bonding process. In various embodiments, a pressure and/or a heat may be applied to the first wafer 310 and/or second wafer 320 to form the bonded structure 330. In an embodiment, for example, a heat may be applied to a temperature in a range from about 100° C. to about 500° C. In an embodiment, for example, a pressure may be in a range from about 10 KN to about 100 KN. For example, for an Al—Ge bonding process, the temperature may range from approximately 420° C. to approximately 450° C. and the pressure may range from about 30 KN to approximately 55 KN.

Following the eutectic bonding process, the seal ring structure 340 may provide a hermetic seal between the first and second wafers 310, 320 that may protect the test pads 316, the first die seal ring 315 and/or the second die seal ring 325 during subsequent post-bonding processing that may be performed on the bonded structure 330. For example, the seal ring structure 340 may provide protection for moisture, chemicals, and/or residue from penetrating the bonded structure 330 during subsequent manufacturing processes. For example, such processes may include, but are not limited to, chemical-mechanical polishing ("CMP"), grinding, etching, deposition or other manufacturing processes.

FIGS. 4A-4B illustrate cross-sectional views of intermediate stages for forming a wafer seal ring according to an embodiment. The embodiments as shown in FIGS. 4A-4B may provide for wafer bonding using eutectic bonding processes. FIGS. 4A-4B illustrate a first and a second wafer 410, 420. Only a portion of the first and the second wafers 410, 420 is shown in FIGS. 4A-4B.

The first wafer 410 may have formed thereon a wafer seal ring 414 comprising a first structural portion 414a and a second structural portion 414b. The first wafer 410 may include a first substrate 411. On the first substrate 411, may be formed the first structural portion 414a of the wafer seal ring 414. On the first structural portion 414a may be formed the second structural portion 414b, which may, for example, be a bonding layer for the wafer seal ring 414.

A die seal ring (not shown) may be formed on the first wafer 410. The wafer seal ring 414 may be formed to an overall height $H_{SR}$ that may be approximately equal to a height of the die seal ring (not shown). The wafer seal ring 414 may be formed to have an approximately uniform width $W_{SR}$. In an embodiment, additional wafer seal rings (not shown) may be formed on the first wafer 410.

The second wafer 420 may include a second substrate 421. The second wafer 420, as shown in FIG. 4A, may not have a wafer seal ring formed thereon. The first wafer 410 and the second wafer 420 may be aligned and bonded together as shown in FIG. 4B to form a bonded structure 440. The bonding may be performed using various eutectic bonding processes. Bonding the first and the second wafers 410, 420 together to form the bonded structure 440 may form a seal ring structure 430 between the wafers.

In various embodiments, the first structural portion 414a of the wafer seal ring 414 may be made of a dielectric material, a metal material, or a semiconductor material. In various embodiments, the second structural portion 414b of the wafer seal ring 414 may be made of materials including a eutectic alloy such as AlCu, AlGe or the like or a low-melting point metal layer such as In, Au, Sn, Cu or the like. In an embodiment, the second structural portion 414b may include multiple layers.

In various embodiments, the first and/or second substrate 411, 421 may comprise bulk silicon. In other embodiments, first and/or second substrate 411, 421 may comprise any semiconductor substrate, ceramic substrate, quartz substrate or the like. Other substrates that may be used include multi-layered substrates, gradient substrates, or hybrid orientation substrates.

FIGS. 4C-4D illustrate cross-sectional views of intermediate stages for forming a wafer seal ring according to another embodiment. The embodiments as shown in FIGS. 4C-4D may provide for wafer bonding using eutectic bonding processes. FIGS. 4C-4D illustrate a first and a second wafer 450, 460. Only a portion of the first and the second wafers 450, 460 is shown in FIGS. 4C-4D.

The first wafer 450 may have formed thereon a first wafer seal ring 454 having a first structural portion 454a and a second structural portion 454b. The first wafer 450 may include a first substrate 451. On the first substrate 451 may be formed the first structural portion 454a of the first wafer seal ring 454. On the first structural portion 454a may be formed the second structural portion 454b, which may, for example, be a bonding layer for the first wafer seal ring 454.

One or more first die seal rings (not shown) may be formed on the first wafer 450. The first wafer seal ring 454 may be formed to an overall height $H_{1SR}$ that may be approximately equal to a height of the one or more first die seal rings (not shown). The first wafer seal ring 454 may be formed to have an approximately uniform width $W_{1SR}$. In an embodiment, additional first wafer seal rings (not shown) may be formed on the first wafer 450.

The second wafer 460 may have formed thereon a second wafer seal ring 464 having a first structural portion 464a and a second structural portion 464b. The second wafer 460 may include a second substrate 461. On the second substrate 461, may be formed the first structural portion 464a of the second wafer seal ring 464. On the first structural portion 464a may be formed the second structural portion 464b, which may, for example, be a bonding layer for the second wafer seal ring 464.

One or more second die seal ring (not shown) may be formed on the second wafer 460. The second wafer seal ring 464 may be formed to an overall height $H_{2SR}$ that may be approximately equal to a height of the one or more second die seal rings (not shown). The second wafer seal ring 464 may be formed to have an approximately uniform width $W_{2SR}$. The second wafer seal ring 464 may be formed to align and have an approximately equal width $W_{2SR}$ with the first wafer seal ring 317, which may promote bonding and sealing for the first and second wafer seal rings 317, 327. In an embodiment, additional second wafer seal rings (not shown) may be formed on the second wafer 460.

The first wafer 450 and the second wafer 460 may be aligned and bonded together as shown in FIG. 4D to form a bonded structure 480. The bonding may be performed using various eutectic bonding processes. Bonding the first and the second wafers 450, 460 together may include bonding the first and second wafer seal rings 454, 464 together, which may form a seal ring structure 470 between the first and the second wafers 450, 460.

In various embodiments, the first structural portion 454a of the first wafer seal ring 454 may be made of a dielectric material, a metal material, or a semiconductor material. In various embodiments, the second structural portion 454b of the first wafer seal ring 454 may be made of materials including, but not limited to, a eutectic alloy such as AlCu, AlGe or the like or a low-melting point metal layer such as In, Au, Sn, Cu or the like. In an embodiment, the second structural portion 454b may include multiple layers.

In various embodiments, the first structural portion 464a of the second wafer seal ring 464 may be made of a dielectric material, a metal material, or a semiconductor material. In various embodiments, the second structural portion 464b of the second wafer seal ring 464 may be made of materials including, but not limited to, a eutectic alloy such as AlCu, AlGe or the like or a low-melting point metal layer such as In, Au, Sn, Cu or the like. In an embodiment, the second structural portion 464b of the second wafer seal ring 464 may include multiple layers.

In various embodiments, the first and/or second substrate 451, 461 may comprise bulk silicon. In other embodiments, first substrate and/or second substrate 451, 461 may comprise any semiconductor substrate, ceramic substrate, quartz substrate or the like. Other substrates that may be used include multi-layered substrates, gradient substrates, or hybrid orientation substrates.

FIGS. 5A-5B illustrate cross-sectional views of intermediate stages for forming a wafer seal ring according to an embodiment. The embodiments as shown in FIGS. 5A-5B may provide for wafer bonding using fusion bonding processes. FIGS. 5A-5B illustrate a first and a second wafer 510, 520. Only a portion of the first and second wafers 510, 520 is shown in FIGS. 5A-5B. The first wafer 510 may have formed thereon a wafer seal ring 514. The wafer seal ring 514 as shown in FIGS. 5A-5B illustrate two seal rings. In various embodiments, more or fewer wafer seal rings may be formed on the first wafer 510.

The first wafer 510 may include a first substrate 511. One or more die seal rings (not shown) may be formed on the first wafer 510. The wafer seal ring(s) 514 may be formed to a height $H_{SR}$ that may be approximately equal to a height of the one or more die seal rings (not shown). The wafer seal ring(s) 514 may be formed to have an approximately uniform width $W_{SR}$. Although the width $W_{SR}$ may be approximately uniform for each wafer seal ring 514, in various embodiments, the individual uniform width of each ring may differ from or be approximately equal to the width of another ring on the first wafer 510.

The second wafer 520 may include a second substrate 521. The second wafer 520 may not have a wafer seal ring formed thereon. The first wafer 510 and the second wafer 520 may be aligned and bonded together as shown in FIG. 5B to form a bonded structure 540. The bonding may be performed using various fusion bonding processes. In various embodiments, a post-bond anneal may be performed may be performed at temperatures ranging from approximately 300° C. to approximately 1000° C., which may enhance bonding strength. Bonding the first and second wafers 510, 520 together to form the bonded structure 540 may form a seal ring structure 530 between the first and second wafers 510, 520.

In various embodiments, the first and/or second substrate 511, 521 may comprise bulk silicon. In other embodiments, first substrate and/or second substrate 511, 521 may comprise any semiconductor substrate, ceramic substrate, quartz substrate or the like. Other substrates that may be used include multi-layered substrates, gradient substrates, or hybrid orientation substrates.

In various embodiments, the wafer seal ring 514 may be made of a semiconductor material or a substrate material which may be the same as or different from the materials of the first and/or second substrate 511, 521. In various embodiments, the wafer seal ring 514 may be formed on the second wafer 520 rather than the first wafer 510, as determined by a designer.

FIGS. 5C-5D illustrate cross-sectional views of intermediate stages for forming a wafer seal ring according to another embodiment. The embodiments as shown in FIGS. 5C-5D may provide for wafer bonding using fusion bonding processes. FIGS. 5C-5D illustrate a first and a second wafer 550, 560. Only a portion of the first and second wafers 550, 560 are shown in FIGS. 5C-5D.

The first wafer 550 may include a first substrate 551. The first wafer 550 may have formed thereon a wafer seal ring 554. The wafer seal ring 554 as shown in FIGS. 5A-5B illustrate two seal rings. In various embodiments, more or fewer wafer seal rings may be formed on the first wafer 550. One or more die seal rings (not shown) may be formed on the first wafer 550. The wafer seal ring(s) 554 may be formed to a height $H_{SR}$ that may be approximately equal to a height of the one or more die seal rings (not shown).

The wafer seal ring(s) 554 may be formed to have an approximately uniform width $W_{SR}$. Although the width $W_{SR}$ may be approximately uniform for each wafer seal ring 514, in various embodiments, the individual uniform width of each ring may differ from or be approximately equal to the width of another ring on the first wafer 510.

The second wafer 560 may include a second substrate 561 and an alignment post 562. The alignment post 562 may aid in alignment of the first and second wafer 550, 560 during wafer bonding. The alignment post 562 may be formed to a height Hp, which may be approximately equal to or less than the height $H_{SR}$ of the wafer seal ring(s) 554. The alignment post 562 may be formed at a location on the second wafer 560 that may promote alignment with the first wafer 550. For example, the alignment post 562, as shown in FIG. 5C may be formed on the second wafer 560 to align between the wafer seal ring(s) 554 for bonding the first and second wafers 550, 560.

In various embodiments, a plurality of alignment posts (not shown) may be formed to align on opposing sides of the wafer seal ring(s) 554. It should be understood, that use of an alignment post is not limited to embodiments incorporating fusion bonding processes and may also be used in embodiments incorporating eutectic bonding processes as discussed previously.

The first wafer 550 and the second wafer 560 may be aligned and bonded together as shown in FIG. 5D to form a bonded structure 580. The bonding may be performed using various fusion bonding processes. Bonding the first and second wafers 550, 560 together to form the bonded structure 580 may form a seal ring structure 570 between the first and second wafers 550, 560.

In various embodiments, the first and/or second substrate 551, 561 may comprise bulk silicon. In other embodiments, first substrate and/or second substrate 551, 561 may comprise any semiconductor substrate, ceramic substrate, quartz substrate or the like. Other substrates that may be used include multi-layered substrates, gradient substrates, or hybrid orientation substrates. In various embodiments, the wafer seal ring 554 may be made of a semiconductor material or a substrate material which may be the same as or different from the materials of the first and/or second substrate 551, 561.

In an embodiment, an apparatus is provided. The apparatus may include a pair of bonded wafers, at least one of the wafers having a plurality dies formed thereon; a plurality of die seal rings, wherein each of the die seal rings is formed around each of the plurality of dies; and a wafer seal ring between the bonded wafers, the wafer seal ring having a uniform width, wherein the wafer seal ring is formed to surround the plurality of die seal rings The wafer seal ring may be formed to a height approximately equal to a height of the die seal rings.

In another embodiment, another apparatus is provided. The apparatus may a wafer having a plurality of dies formed thereon; a plurality of die seal rings, each die seal ring formed around each of the plurality of dies; and a wafer seal ring, the wafer seal ring having a uniform width, wherein the wafer seal ring is formed to surround the plurality of dies. The wafer seal ring may be formed to a height approximately equal to a height of the die seal rings.

In another embodiment, a method is provided. The method may comprise forming a plurality of dies on a wafer; forming a plurality of die seal rings on the wafer, each die seal ring formed around a corresponding die; and forming a wafer seal ring on the wafer, wherein the wafer seal ring surrounds the plurality of dies and is formed to a height approximately equal to a height of the plurality of die seal rings.

In another embodiment, a method includes forming a plurality of dies on a first wafer. A plurality of die seal rings is formed on the first wafer, each die seal ring encircling a corresponding die of the plurality of dies. A first wafer seal ring and a second wafer seal ring are formed on the first wafer, wherein the first wafer seal ring surrounds the plurality of dies, and wherein the second wafer seal ring surrounds the first wafer seal ring. An alignment post is formed on a second wafer. The first wafer is aligned with respect to the second wafer by inserting the alignment post in a gap between the first wafer seal ring and the second wafer seal ring. The first wafer is bonded to the second wafer to form a bonded structure.

In another embodiment, a method includes forming a plurality of dies on a first wafer. A plurality of die seal rings is formed on the first wafer, each die seal ring encircling a corresponding die of the plurality of dies. A first layer of a plurality of concentric wafer seal rings is formed on the first wafer, the first layer of the plurality of concentric wafer seal rings comprising a first material. A second layer of the plurality of concentric wafer seal rings is formed on the first layer of the plurality of concentric wafer seal rings, the second layer of the plurality of concentric wafer seal rings comprising a second material, the plurality of concentric wafer seal rings encircling the plurality of die seal rings. The first wafer is bonded to a second wafer.

In another embodiment, a structure includes a first wafer, the first wafer including a die, and a die seal ring on the first wafer, the die seal ring encircling the die, the die seal ring having a first height. The structure further includes a first wafer seal ring on the first wafer, the first wafer seal ring surrounding the die seal ring, the first wafer seal ring having a second height, the first height being substantially equal to the second height, and a second wafer seal ring on the first wafer, the second wafer seal ring encircling the first wafer seal ring, the second wafer seal ring having the second height. The structure further includes a second wafer bonded to the first wafer, and an alignment post on a second wafer, the alignment post being interposed between the first wafer seal ring and the second wafer seal ring.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure. For example, formation of wafer seal rings on either wafer is within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a plurality of dies on a first wafer;
    forming a plurality of die seal rings on the first wafer, each die seal ring encircling a corresponding die of the plurality of dies;
    forming a first wafer seal ring and a second wafer seal ring on the first wafer, wherein the first wafer seal ring surrounds the plurality of dies, and wherein the second wafer seal ring surrounds the first wafer seal ring;
    forming an alignment post on a second wafer;
    aligning the first wafer with respect to the second wafer by inserting the alignment post in a gap between the first wafer seal ring and the second wafer seal ring; and
    bonding the first wafer to the second wafer to form a bonded structure.

2. The method of claim 1, further comprising forming a MEMS device on at least one of the first wafer and the second wafer.

3. The method of claim 1, wherein bonding the first wafer to the second wafer comprises using a fusion bonding method.

4. The method of claim 1, wherein bonding the first wafer to the second wafer comprises using an eutectic bonding method.

5. The method of claim 1, wherein a height of the alignment post is less than a height of the first wafer seal ring.

6. The method of claim 1, wherein a width of the alignment post is substantially equal to a width of the gap.

7. The method of claim 1, further comprising annealing the bonded structure.

8. A method comprising:
    forming a plurality of dies on a first substrate, the first substrate comprising a first material;
    forming a plurality of die seal rings on the first substrate, each die seal ring encircling a corresponding die of the plurality of dies;
    forming a plurality of concentric wafer seal rings on the first substrate, wherein the plurality of concentric wafer seal rings surrounds the plurality of die seal rings, and wherein the plurality of concentric wafer seal rings comprises a second material;
    forming an alignment post on a second substrate;
    aligning the first substrate with respect to the second substrate by inserting the alignment post between a first wafer seal ring of the plurality of concentric wafer seal rings and a second wafer seal ring of the plurality of concentric wafer seal rings, wherein the first wafer seal ring is adjacent to the second wafer seal ring; and
    bonding the first substrate to the second substrate.

9. The method of claim 8, wherein the first material is same as the second material.

10. The method of claim 8, wherein the first material is different from the second material.

11. The method of claim 8, wherein a height of the alignment post is less than a height of the first wafer seal ring.

12. The method of claim 8, wherein a height of the alignment post is substantially equal to a height of the first wafer seal ring.

13. The method of claim 8, wherein a height of the plurality of die seal rings is substantially equal to a height of the plurality of concentric wafer seal rings.

14. The method of claim 8, further comprising, after bonding the first substrate to the second substrate, annealing the first substrate and the second substrate.

15. A method comprising:
    forming a plurality of dies on a first substrate;
    forming a first wafer seal ring and a second wafer seal ring on the first substrate, wherein the first wafer seal ring surrounds the plurality of dies, and wherein the second wafer seal ring surrounds the first wafer seal ring;
    forming an alignment post on a second substrate;
    aligning the first substrate with respect to the second substrate by inserting the alignment post in a gap between the first wafer seal ring and the second wafer seal ring, wherein a first sidewall of the alignment post physically contacting a sidewall of the first wafer seal ring, and wherein a second sidewall of the alignment post physically contacting a sidewall of the second wafer seal ring; and
    bonding the first substrate to the second substrate to form a bonded structure.

16. The method of claim 15, further comprising forming a plurality of die seal rings on the first substrate, wherein each die seal ring encircles a corresponding die of the plurality of dies.

17. The method of claim 15, further comprising forming a MEMS device on at least one of the first substrate and the second substrate.

18. The method of claim 15, wherein a width of the alignment post is substantially equal to a distance between the first wafer seal ring and the second wafer seal ring.

19. The method of claim 15, further comprising annealing the bonded structure at a temperature between about 300° C. and about 1000° C.

20. The method of claim 15, wherein the alignment post is spaced apart from the first substrate.

* * * * *